United States Patent [19]

Kuroda et al.

[11] 4,085,389

[45] Apr. 18, 1978

[54] AMPLITUDE MODULATION CIRCUIT

[75] Inventors: Masahiro Kuroda; Hiromitsu Yoshimura, both of Tokyo, Japan

[73] Assignee: Anritsu Electric Company Limited, Tokyo, Japan

[21] Appl. No.: 764,791

[22] Filed: Feb. 2, 1977

[30] Foreign Application Priority Data

Sep. 29, 1976  Japan .................................. 51/117017

[51] Int. Cl.² .............................................. H03C 1/40
[52] U.S. Cl. .................................. 332/31 T; 325/182; 332/59
[58] Field of Search .................... 332/31 R, 31 T, 59, 332/60; 325/182

[56] References Cited

U.S. PATENT DOCUMENTS

| 3,539,947 | 11/1970 | Frantz | 332/31 T |
| 3,585,530 | 6/1971 | Wahlgren | 332/60 X |

Primary Examiner—Siegfried H. Grimm
Attorney, Agent, or Firm—Frank J. Jordan

[57] ABSTRACT

An amplitude modulation circuit which comprises a modulating circuit for applying a modulating signal to a modulated stage, and a voltage regulator arranged to regulate a D.C. voltage to be supplied to the modulated stage at a predetermined constant level and having a circuit means adapted to provide a high impedance for the modulating signal applied to the modulated stage.

7 Claims, 6 Drawing Figures

AMPLITUDE MODULATION CIRCUIT

This invention relates to amplitude modulation system in which a radio frequency carrier wave is amplitude modulated by a modulating signal such as a voice or other intelligence signal.

Conventional amplitude modulating systems have been in use for former times, especially in regard to the short wave band. Although there has been a recent expansion in the popularity of single sideband modulating systems which have advantages such as reduced occupied bandwidth, there are still many cases even at prevent in which conventional amplitude modulation employing comparatively simple circuitry is adopted for uncomplicated, low power output radios such as citizen band transceivers. These amplitude modulating systems usually employ a modulated stage and a modulating transformer or choke coil each of which is serially connected with the power supply and the collector of the modulated transistor. In these systems, the voltage which is applied to the transformer is used to vary the collector-to-emitter voltage of the modulated transistor, thus amplitude modulating the carrier wave. Certain drawbacks are inherent in these systems such as the relatively high cost of the transformer or the choke coil and the fact that the frequency response of the transformer or the choke coil may be limited for certain applications.

It is, therefore, an object of the present invention to provide an amplitude modulation circuit which overcomes the shortcomings encountered in prior art.

It is another object of the present invention to provide an amplitude modulation circuit which does not require modulation transformer or choke coil means.

It is still another object of the present invention to provide an amplitude modulation circuit which is arranged to provide relatively wide frequency response and reliable circuit operation at all times.

It is another object of the present invention to provide an amplitude modulation system which is highly stable in operation irrespective of variations or drop in a D.C. voltage applied to a modulated stage.

It is a still further object of the present invention to provide an amplitude modulation circuit which is remarkably reduced in size and weight, easy to adjust the carrier power output and low in manufacturing cost.

It is a still further object of the present invention to provide an amplitude modulation circuit which employs a minimum number of component parts to provide a compact construction.

These and other objects, features and advantages of the present invention will become more apparent from the following description when taken in conjunction with the accompanying drawings, in which.

Figure 1:
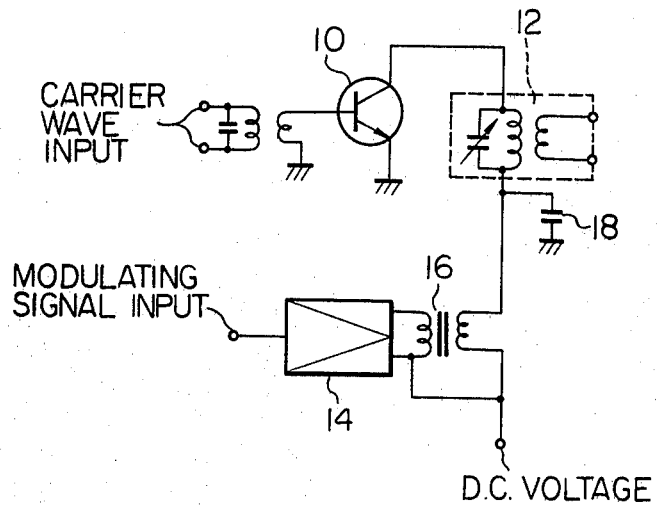
FIG. 1 shows an example of a conventional collector modulation circuit employing a modulating transformer.

Referring now to FIG. 1, there is shown an example of an electric circuitry for a conventional amplitude modulation circuit. In FIG. 1, the carrier wave to be modulated is applied to the base electrode of a transistor 10 having its emitter grounded and its collector connected to a resonant output circuit 12. The modulating signal is applied through a modulation amplifier 14 to a modulating transformer 16, to which a D.C. supply voltage is applied. Then, the modulating voltage is superimposed on the D.C. supply voltage and applied to the collector electrode of R.F. modulated transistor 10 through the resonant output circuit 12, by which a modulated carrier wave is obtained. Indicated as 18 is an R.F. bypass capacitor.

Figure 2:
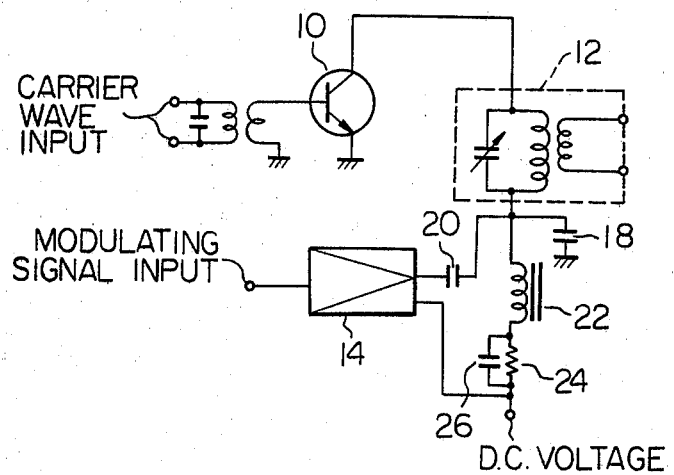
FIG. 2 is similar to FIG. 1 but shows another example employing a modulating choke coil.

FIG. 2 shows another example of the conventional amplitude modulation circuit, with like components bearing like reference numerals as those used in FIG. 1. In FIG. 2, the transformer 16 is replaced with a coupling capacitor 20 and a modulating choke 22 with which a resistor 24 is serially connected. A resistor 24, associated with a bypass capacitor 26, is provided to decrease the voltage applied to the collector of the transistor 10 thereby to reduce D.C. power input to a prescribed value.

In collector modulation circuits of this type, a modulation transformer or modulation choke coil are indispensable items through which the D.C. collector current of the transistor 10 flows; accordingly, since it is necessary to take magnetic saturation into account, such circuits are generally large in size, heavy, and require particular specifications. Moreover, as semiconductor circuit elements such as transistors have recently become inexpensive and readily obtainable, it is no longer desirable to make use of modulating transformers and choke coils in citizen band transceivers and the like in view of cost, design and structural considerations. Finally, in battery-operated portable transceivers which make use of circuits as shown in FIG. 1, a decrease in the modulated output stage supply voltage due to aging cannot be avoided and is of course accompanied by a drop in the carrier wave output and often results in a deterioration of modulation characteristics and spurious radiation.

The present invention proposes to provide a practical modulator circuit of the afore-mentioned type but which is devoid of the problems encountered in the conventional collector modulation circuits employed in simple wireless transmitters.

Figure 3:
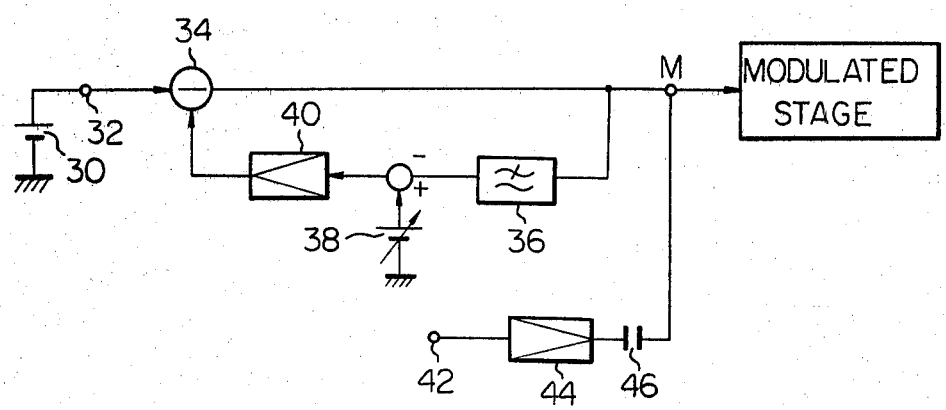
FIG. 3 is a block diagram of preferred embodiment of an amplitude modulation circuit according to the present invention.

FIG. 3 shows a block diagram of an amplitude modulation circuit according to the present invention, wherein reference numeral 30 denotes a D.C. supply voltage source such as a battery, 32 a terminal, 34 a control means of which current is controlled by a control signal, 36 a low-pass filter, 38 a reference voltage source to provide a predetermined reference voltage capable of being set to a desired voltage, 40 an error amplifier, 42 a modulation signal input terminal, 44 a modulator and 46 a coupling capacitor for coupling the modulator output. As may be appreciated from FIG. 3, the closed loop circuit constituted by the elements 34, 36, 38 and 40 functions as a voltage regulator for D.C. current and frequencies below the cut-off frequency $f_c$ of the low-pass filter 36, while the loop circuit presents the characteristics of a constant current circuit for frequencies above $f_c$ and offers a high output impedance.

Figure 4:
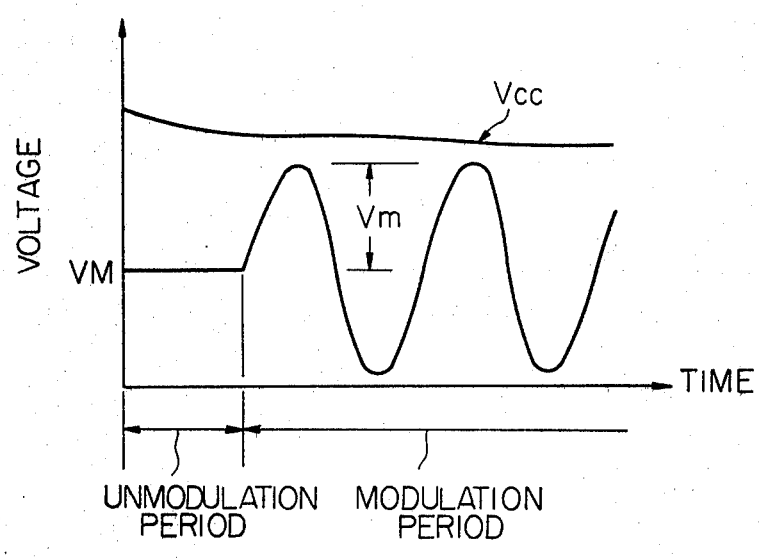
FIG. 4 is a graph showing the relationship between a regulated D.C. voltage and a modulating signal waveform applied to the modulated stage shown in FIG. 3.

A voltage $V_M$ (the D.C. supply voltage applied to the modulated stage) at a point M in an unmodulated state can be represented by the following relation in terms of the D.C. voltage Vcc at the terminal 32:

$$V_M \simeq Vc - Vo/2$$

wherein $V$. is a minimum operating voltage by which the control means 34 can be rendered operative. Presetting the reference voltage 38 so as to satisfy the above conditions for $V_M$ and selecting the output amplitude voltage $V_m$ produced by the modulator 44 to have a value less than $V_M$, the potential $V_M$ at the point M varies as shown in FIG. 4 when the value for $f_c$ selected is below the lower limit $f_{mL}$ of the modulating signal frequency band and $V_m$ is superimposed upon $V_M$. It thus follows that if the modulated stage of the circuit shown in FIGS. 1 and 2 is connected to the point M, the amplitude modulation can be obtained.

Figure 5:
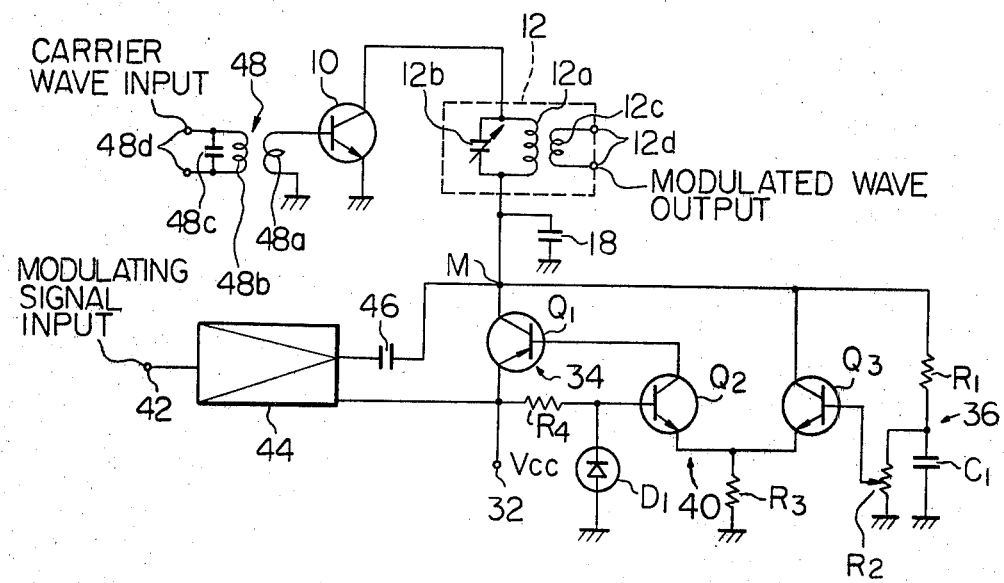
FIG. 5 is an example of a detail circuitry for the amplitude modulation circuit shown in FIG. 3.

FIG. 5 illustrates a preferred embodiment of the present invention. Resistor R1 and capacitor C1 connected in series therewith constitute the low pass filter 36 the cut-off frequency $f_c$ of which is given by the formula $f_c \simeq 1/2\pi C1R1$, where $R2 >> R1$. As stated previously, $f_c$ is selected to have a value below the lower limit $f_{mL}$ of the modulating signal frequency band. Variable resistor R2 has one end connected to the junction between the resistor R1 and the capacitor C1 and another end grounded. A resistor R4, a zener diode D1 and a potentiometer R2 serve as a variable reference voltage circuit. The error amplifier 40 is composed of transistors Q2 and Q3. The output of the zener diode D1 is applied to the base electrode of the transistor Q2, and the voltage at the point M is applied to the base electrode of the transistor Q3 via the low pass filter 36 which attenuate only the modulating signal and the potentiometer R2. When a potential difference exists across both electrodes of error amplifier transistors Q1 and Q2, an error voltage is generated as a control signal at the collector of the transistor Q2 and applied to the base electrode of a transistor Q1 serving as the control means 34. As a result the transistor Q1 functions to regulate the potential at the point M to zero the error voltage whereby a regulated voltage is maintained at the predetermined level even in a case where the D.C. voltage at the terminal 32 drops. The predetermined level is set by adjusting the potentiometer R2. The point M is connected to one end of a resonant circuit 12 composed of a primary inductor 12a and a variable capacitor 12b connected in parallel therewith. A secondary inductor 12c is inductively coupled with the inductor 12a to feed a modulated wave output at output terminals 12d. The other end of the resonant circuit 12 is connected to the collector of the modulated transistor 10 of one conductivity type opposite in conductivity to the transistor Q1. The base of the modulated transistor 10 is connected to an input circuit 48 composed of a secondary inductor 48a having its one end connected to the base of the modulated transistor 10 and its another end directly grounded, a primary inductor 48b inductively coupled to the secondary inductor 48a, and a capacitor 48c connected to input terminals 48d in parallel with the primary inductor 48b to which a carrier wave is applied.

For a modulating signal with a frequency higher than the cut-off frequency $f_c$ of the low-pass filter 36, the closed loop voltage regulator as described above in effect goes to an open loop state whereby the transistor Q1 offers a high impedance since it is connected as a collector follower. Thus, the output voltage of modulator 44 can be superimposed via the coupling capacitor 46 upon the D.C. voltage at point M in substantially the same manner as the modulating choke of FIG. 2, and modulation is performed at the collector of the modulated transistor 10 with the amplitude modulated wave output obtained at the resonant output circuit 12.

It is clear from the foregoing that the present invention makes it possible to dispense with costly modulating transformers and choke coils which were necessary items in conventional collector or plate modulation circuits. Thus by utilizing readily obtainable semi-conductors and suitably arranging these and other components, amplitude modulation can be obtained and the D.C. supply voltage for the modulating stage stabilized. Moreover, fine control of this D.C. supply voltage is possible without making use of the voltage dropping resistor 24 and modulating signal bypass capacitor 26 which are found in conventional modulator circuits as depicted in FIG. 2, offering a labor-saving factor when a large number of manufactured sets are to be adjusted.

Figure 6:
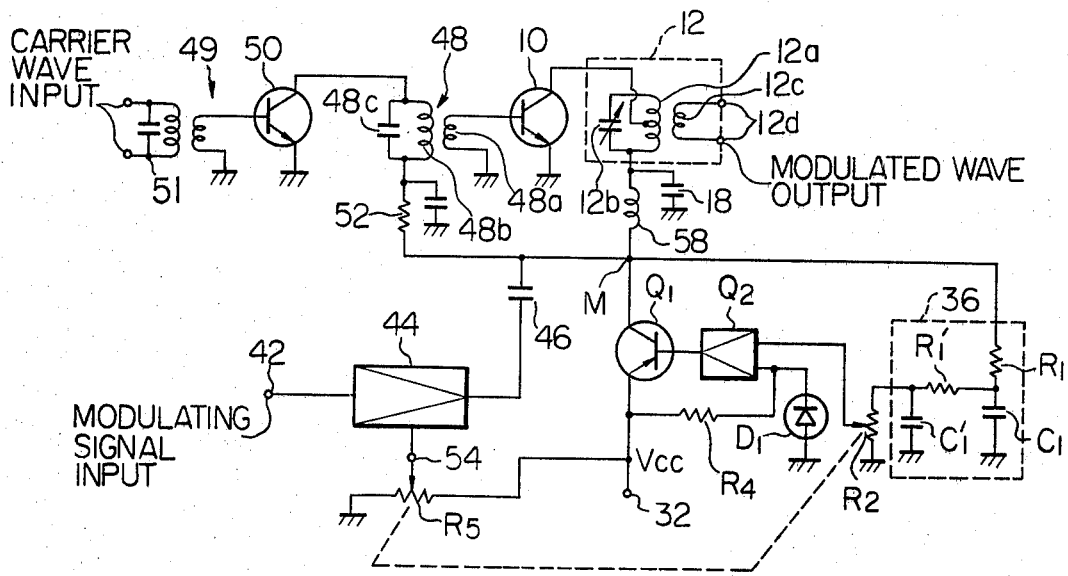
FIG. 6 is similar to FIG. 5 but shows another example of the detail circuitry for the circuit shown in FIG. 3.

FIG. 6 shows another preferred embodiment of the present invention. The operation of the circuit shown is substantially the same as described with respect to the circuit of FIG. 5 although the modulated stage includes not only a final stage transistor 10 but also an excitation stage 49 composed of a transistor 50 and an input circuit 51 identical to the circuit 48. Such an arragement while effecting collector modulation also enhances the modulated wave output at the final stage. Resistor 52 is provided in the circuit in order to adjust the peak amplitude of the excitation stage to an appropriate value. Another feature which distinguishes this circuit from that of FIG. 5 is the incorporation of a circuit adapted to permit the external control of the signal amplitude provided by the modulator 44. The amplitude of the modulating signal can be freely controlled by a variable resistor R5 connected to a terminal 54. Resistor R5 is connected at its one end to the D.C. voltage supply terminal 32 and grounded at its another end. Thus, adjustment of the resistor R5 alone or in combination with the resistor R2 which sets the variable reference voltage makes it possible to correlatively vary at the point M the D.C. voltage $V_M$ and the maximum amplitude $V_m$ obtained as an output from the modulator 44. Hence, for any input modulating signal whatsoever, over-modulation can be eliminated by preventing $V_m$ from exceeding $V_M$, and a reduction in the modulating wave output can be controlled whle maintaining a suitable degree of modulation over a wide range. A high frequency choke 58 is connected between the output circuit 12 and the point M to prevent the carrier wave from being applied to the point M.

It should be understood that although the embodiment as depicted in FIGS. 5 and 6 make use of emitter-grounded transistors in the modulated stage, a plate modulated output could equally well be obtained in exactly the same manner even if a vacuum tube circuit employing a cathode-grounded vacuum tube were employed.

While the present invention has been shown and described with reference to particular embodiments by way of example, it should be noted that various other changes or modifications may be made without departing from the scope of the present invention.

What is claimed is:

1. An amplitude modulation circuit having a D.C. voltage source and comprising:

a modulated stage adapted to receive a carrier wave;
a resonant circuit connected at one end thereof to said modulated stage to provide a modulated carrier wave;
a modulator connected to the other end of said resonant circuit to apply thereto a modulating signal;
a voltage regulator connected between said D.C. voltage source and the other end of said resonant circuit to regulate a D.C. voltage applied to said resonant circuit at a predetermined constant level; and
a coupling capacitor connected between said modulator and the otheer end of said resonant circuit;
said voltage regulator including control means having its input coupled to said D.C. voltage source and its output coupled to the other end of said resonant circuit, an error amplifier to generate a control signal when a potential difference exists between the output of said control means and said predetermined constant level, and a low pass filter connected between the output of said voltage regulator and an input of said error amplifier and having a cut-off frequency selected below a lower limit of a frequency band of the modulating signal, said control means being operative in response to said control signal to zero the potential difference for thereby regulating the D.C. voltage applied to the other end of said resonant circuit to said predetermined constant level when said frequency band is below said cut-off frequency and operative to provide high impedance for the modulating signal when said frequency band exceeds beyond said cut-off frequency of said low pass filter.

2. An amplitude modulation circuit according to claim 1, in which said low pass filter comprises a resistor and a capacitor connected in series between the output of said control means and the ground.

3. An amplitude modulation circuit according to claim 1, in which said error amplifier comprises first and second transistors, a first resistor connected between the ground and emitter electrodes of said first and second transistors, a zener diode connected between the ground and a base electrode of said first transistor, and a second resistor connected between said D.C. voltage source and the base electrode of said first transistor, said first transistor having a collector electrode connected to an input of said control means, and said second transistor having a base electrode connected to an output of said low pass filter and a collector electrode connected to the output of said control means.

4. An amplitude modulation circuit according to claim 3, further comprising a variable resistor connected between the base electrode of said second transistor and the ground to set said predetermined constant level.

5. An amplitude modulation circuit according to claim 1, in which said modulated stage comprises an excitation stage adapted to receive the carrier wave, and a final stage composed of an input circuit having a primary inductor connected to an output of said excitation stage and a secondary inductor inductively coupled to said primary inductor, and a final stage transistor having a base electrode connected to said secondary inductor, an emitter electrode grounded and a collector electrode connected to said one end of said resonant circuit.

6. An amplitude modulation circuit according to claim 1, further comprising means for controlling the amplitude level of said modulating signal.

7. An amplitude modulation circuit according to claim 1, in which said control means comprises a transistor of one conductivity type, and said modulated stage includes a transistor of opposite conductivity type.

* * * * *